(12) United States Patent
Chen

(10) Patent No.: US 8,345,895 B2
(45) Date of Patent: Jan. 1, 2013

(54) DIAPHRAGM OF MEMS ELECTROACOUSTIC TRANSDUCER

(75) Inventor: Li-Che Chen, Pingtung County (TW)

(73) Assignee: United Microelectronics Corp., Hsinchu (TW)

( * ) Notice: Subject to any disclaimer, the term of this patent is extended or adjusted under 35 U.S.C. 154(b) by 807 days.

(21) Appl. No.: 12/179,871

(22) Filed: Jul. 25, 2008

(65) Prior Publication Data
US 2010/0020991 A1 Jan. 28, 2010

(51) Int. Cl.
*H04R 25/00* (2006.01)

(52) U.S. Cl. ........ 381/162; 381/150; 381/174; 257/416; 257/419; 257/E21.002; 257/E29.324

(58) Field of Classification Search ........... 381/161, 381/162, 174, 175, 150; 257/416, 419, E21.002, 257/E21.211, E29.324
See application file for complete search history.

(56) References Cited

U.S. PATENT DOCUMENTS

| | | | |
|---|---|---|---|
| 6,535,460 B2 | 3/2003 | Loeppert et al. | |
| 6,829,131 B1 * | 12/2004 | Loeb et al. | 361/234 |
| 6,847,090 B2 | 1/2005 | Loeppert | |
| 6,901,804 B2 | 6/2005 | Torkkeli | |
| 6,936,524 B2 | 8/2005 | Zhu et al. | |
| 6,943,448 B2 | 9/2005 | Gabriel et al. | |
| 6,982,184 B2 | 1/2006 | Silverbrook et al. | |
| 7,019,955 B2 | 3/2006 | Loeb et al. | |
| 7,023,066 B2 | 4/2006 | Lee et al. | |
| 7,049,051 B2 | 5/2006 | Gabriel et al. | |
| 7,053,456 B2 | 5/2006 | Matsuo | |
| 7,084,762 B2 | 8/2006 | Pedrazzini et al. | |
| 7,089,069 B2 | 8/2006 | Gabriel et al. | |
| 7,152,481 B2 | 12/2006 | Wang | |
| 7,202,101 B2 * | 4/2007 | Gabriel et al. | 438/53 |
| 7,215,527 B2 | 5/2007 | Neumann et al. | |
| 7,465,869 B1 * | 12/2008 | Freitas | 84/723 |
| 7,466,064 B2 * | 12/2008 | Sugiura et al. | 310/324 |
| 2002/0094701 A1 | 7/2002 | Biegelsen et al. | |
| 2002/0118850 A1 | 8/2002 | Yeh et al. | |
| 2002/0151816 A1 | 10/2002 | Rich et al. | |
| 2002/0191802 A1 | 12/2002 | Choe et al. | |
| 2004/0170086 A1 * | 9/2004 | Mayer et al. | 367/178 |
| 2005/0005421 A1 | 1/2005 | Wang et al. | |
| 2006/0134904 A1 | 6/2006 | Araki et al. | |
| 2006/0180896 A1 | 8/2006 | Martin et al. | |
| 2006/0272413 A1 | 12/2006 | Vaganov et al. | |
| 2007/0023851 A1 | 2/2007 | Hartzell et al. | |
| 2007/0029894 A1 | 2/2007 | Yamaoka et al. | |
| 2007/0046108 A1 * | 3/2007 | Pearson et al. | 310/10 |
| 2007/0277616 A1 * | 12/2007 | Nikkel et al. | 73/715 |
| 2008/0212409 A1 * | 9/2008 | Lutz | 367/181 |
| 2009/0151455 A1 * | 6/2009 | Wu et al. | 73/584 |

FOREIGN PATENT DOCUMENTS

| | | | |
|---|---|---|---|
| JP | 2008-109541 | * | 5/2008 |
| WO | 0120948 A2 | | 3/2001 |
| WO | 0120948 A3 | | 3/2001 |

* cited by examiner

*Primary Examiner* — Minh-Loan T Tran
*Assistant Examiner* — Fazli Erdem
(74) *Attorney, Agent, or Firm* — Ding Yu Tan

(57) ABSTRACT

A diaphragm of an MEMS electroacoustic transducer including a first axis-symmetrical pattern layer is provided. Because the layout of the first axis-symmetrical pattern layer can match the pattern of the sound wave, the vibration uniformity of the diaphragm can be improved.

2 Claims, 5 Drawing Sheets

DIAPHRAGM OF MEMS ELECTROACOUSTIC TRANSDUCER

BACKGROUND OF THE INVENTION

1. Field of the Invention

The present invention generally relates to a micro-electro-mechanical systems (MEMS) structure, and more particularly, to a diaphragm of an MEMS electroacoustic transducer.

2. Description of Related Art

Electroacoustic transducers typically employ a diaphragm to convert a sound wave into an electrical signal, or convert an electrical signal into a sound wave, which can be used as microphones or speakers. The electroacoustic transducers have applications in a wide variety of fields. For example, in the computer and communication industries, the electroacoustic transducers can be used in products, such as, cell phones, digital cameras, hands-free sets, notebook computers, or the like. In the bio-medical device industry, the electroacoustic transducers can be used in products, such as, hearing aids, bionic ears, or the like.

With rapid development in the electronics industry and continuous advancing in the semiconductor fabrication process and semiconductor package technology, the electroacoustic transducers are being developed toward multifunction. In order to be light, small, thin, power-saving and inexpensive, the electroacoustic transducer are being developed with a trend toward micro electroacoustic transducers that can be incorporated into chips made by the semiconductor fabrication process.

A micro-electro-mechanical systems (MEMS) electroacoustic transducer is such a product that has mechanical and electronic elements incorporated on a silicon wafer using an integrated circuit technology. One example of the MEMS electroacoustic transducer is an MEMS microphone. Currently, the MEMS microphones are usually designed based on capacitive principles. In the capacitive microphone, electrodes are mounted on a flexible diaphragm and a rigid back plate, respectively. A very small backside cavity exists between the diaphragm and the back plate so that the diaphragm can freely vibrate in response to the sound waves. A change in an electric field between the vibrating diaphragm and the back plate results in an electrical signal in an electrical circuit.

However, the diaphragm of the current MEMS electroacoustic transducer typically includes a pattern layer consisting of a plurality of separate mesh patterns. These patterns in the pattern layer may not match the pattern of the sound wave, which may cause the vibration of the diaphragm to be non-uniform and hence poor performance of the MEMS electroacoustic transducer.

SUMMARY OF THE INVENTION

Accordingly, the present invention is directed to a diaphragm of an MEMS electroacoustic transducer that can provide good uniformity of vibration.

The present invention is also directed to a diaphragm of an MEMS electroacoustic transducer that can improve the performance of the MEMS electroacoustic transducer.

The present invention provides a diaphragm of an MEMS electroacoustic transducer. The diaphragm comprises a first axis-symmetrical pattern layer.

According to one embodiment of the present invention, in the above-mentioned diaphragm, the first axis-symmetrical pattern layer comprises more than two axes.

According to one embodiment of the present invention, in the above-mentioned diaphragm, the first axis-symmetrical pattern layer comprises, for example, a wheel-like pattern layer.

According to one embodiment of the present invention, in the above-mentioned diaphragm, the wheel-like pattern layer comprises a concentric ring pattern and a plurality of line patterns. The concentric ring pattern comprises a plurality of ring patterns. Each of the line patterns is connected to the ring patterns, and one end of the each of the line patterns is connected to the innermost ring pattern.

According to one embodiment of the present invention, in the above-mentioned diaphragm, the wheel-like pattern layer comprises a concentric ring pattern and a plurality of line patterns. The concentric ring pattern comprises a plurality of ring patterns. Each of the line patterns is connected to the ring patterns, and one end of the each of the line patterns is positioned at a centre of the ring patterns.

According to one embodiment of the present invention, in the above-mentioned diaphragm, the first axis-symmetrical pattern layer comprises, for example, a spiderweb-like pattern layer.

According to one embodiment of the present invention, in the above-mentioned diaphragm, the spiderweb-like pattern layer comprises a concentric ring pattern and a plurality of line patterns. The concentric ring pattern comprises a plurality of ring patterns. The line patterns are positioned between and connected to two adjacent ring patterns.

According to one embodiment of the present invention, in the above-mentioned diaphragm, the first axis-symmetrical pattern layer comprises, for example, a snowflake-like pattern layer.

According to one embodiment of the present invention, in the above-mentioned diaphragm, the snowflake-like pattern layer comprises a plurality of main branch patterns arranged radially, and a plurality of side branch patterns. One end of each of the side branch patterns is connected to one of the main branch patterns.

According to one embodiment of the present invention, in the above-mentioned diaphragm, two adjacent side branch patterns that are commonly connected to a same main branch pattern are arranged opposite to each other or staggerly.

According to one embodiment of the present invention, in the above-mentioned diaphragm, the first axis-symmetrical pattern layer comprises, for example, a mesh pattern layer including a plurality of triangle ring patterns. The triangle ring patterns are connected to each other at the vertexes thereof.

According to one embodiment of the present invention, in the above-mentioned diaphragm, the first axis-symmetrical pattern layer has a single symmetrical axis.

According to one embodiment of the present invention, in the above-mentioned diaphragm, the first axis-symmetrical pattern layer comprises a plurality of serrated line patterns positioned in parallel with each other.

According to one embodiment of the present invention, in the above-mentioned diaphragm, the diaphragm further comprises an outer frame that encloses and is connected to the first axis-symmetrical pattern layer.

According to one embodiment of the present invention, in the above-mentioned diaphragm, the diaphragm further comprises a sealing agent layer that seals the first axis-symmetrical pattern layer.

According to one embodiment of the present invention, in the above-mentioned diaphragm, the diaphragm further comprises at least one second axis-symmetrical pattern layer positioned on top of the first axis-symmetrical pattern layer.

The present invention provides another diaphragm of an MEMS electroacoustic transducer. The diaphragm comprises a first spiral pattern layer.

According to another embodiment of the present invention, in the above-mentioned diaphragm, the first spiral pattern layer has an outline being a circle, a rectangle, a hexagon, an octagon, or a dodecagon in shape.

According to another embodiment of the present invention, in the above-mentioned diaphragm, the diaphragm further comprises a sealing agent layer that seals the first spiral pattern layer.

According to another embodiment of the present invention, in the above-mentioned diaphragm, the diaphragm further comprises at least one second spiral pattern layer positioned on top of the first spiral pattern layer.

In the diaphragm described above, the layout of the first axis-symmetrical pattern layer or the first spiral pattern layer can match the pattern of the sound wave and, therefore, the diaphragm can produce vibration with good uniformity and thereby improve the performance of the MEMS electroacoustic transducer.

In order to make the aforementioned and other features and advantages of the present invention more comprehensible, embodiments accompanied with figures are described in detail below.

DESCRIPTION OF THE EMBODIMENTS

The diaphragm of the MEMS electroacoustic transducer of the present invention provides a good uniformity of vibration, which can be achieved by configuring a pattern layer of the diaphragm such that the layout of the pattern layer matches the pattern of the sound wave. The diaphragm may be fabricated by, for example, a complementary metal oxide semiconductor (CMOS) MEMS process.

In each embodiment described below, the pattern layer of the diaphragm is described as an axis-symmetrical pattern layer or a spiral pattern layer. Specifically, an axis-symmetrical pattern layer with more than two symmetrical axes is illustrated in each of the first through fifth embodiments. An axis-symmetrical pattern layer with a single symmetrical axis is illustrated in each of the sixth, seventh and ninth embodiments. A spiral pattern layer is illustrated in the eighth embodiment.

Figure 1:
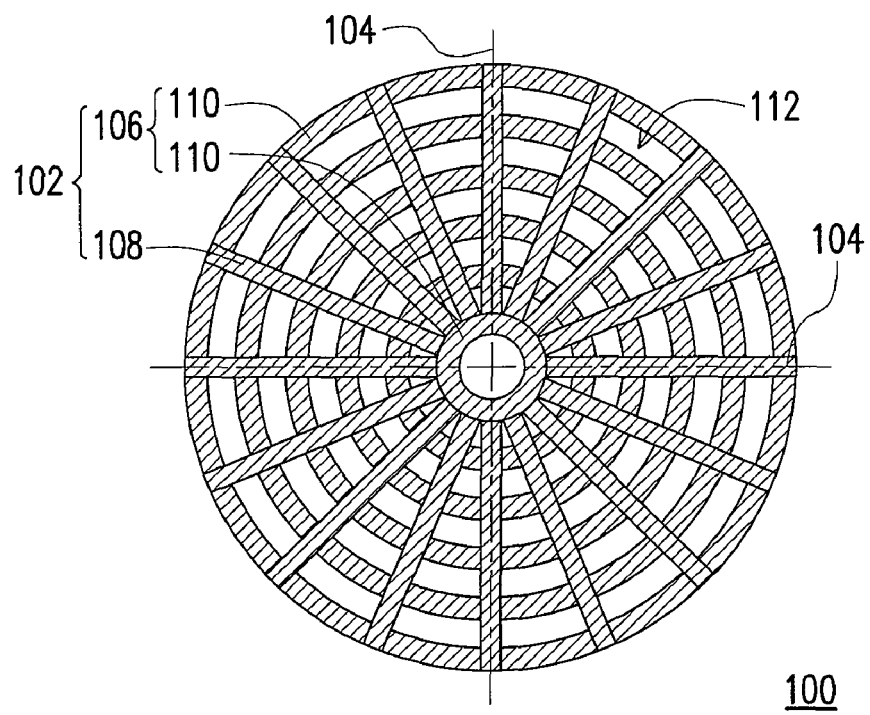
FIG. 1 is a top view of a diaphragm of an MEMS electroacoustic transducer according to a first embodiment of the present invention.

FIG. 1 is a top view of a diaphragm of the MEMS electroacoustic transducer according to a first embodiment of the present invention.

Referring to FIG. 1, the diaphragm 100 includes an axis-symmetrical pattern layer 102 having more than two symmetrical axes 104. In the first embodiment, the axis-symmetrical pattern layer 102 is illustrated as a wheel-like pattern layer. The material of the axis-symmetrical pattern layer 102 is, for example, a conductive material.

The axis-symmetrical pattern layer 102 includes a concentric ring pattern 106 and a plurality of line patterns 108. The concentric ring pattern 106 includes a plurality of ring patterns 110. Each line pattern 108 is connected to the ring patterns 110, and one end of each line pattern 108 is connected to the innermost ring patterns 110, thereby forming the wheel-like pattern with gaps 112.

In this embodiment, the outline of the axis-symmetrical pattern 102 is a circle in shape, but the present invention should not be limited to the circular outline. Rather, it is to be understood that the axis-symmetrical pattern 102, if desired, can have an outline of another shape, such as, rectangle, hexagon, octagon or dodecagon.

In the diaphragm 100 of the first embodiment, the layout of the axis-symmetrical pattern 102 can match the pattern of the sound wave and, therefore, the diaphragm 100 can produce vibration with good uniformity and thereby improve the performance of the MEMS electroacoustic transducer.

Figure 2:
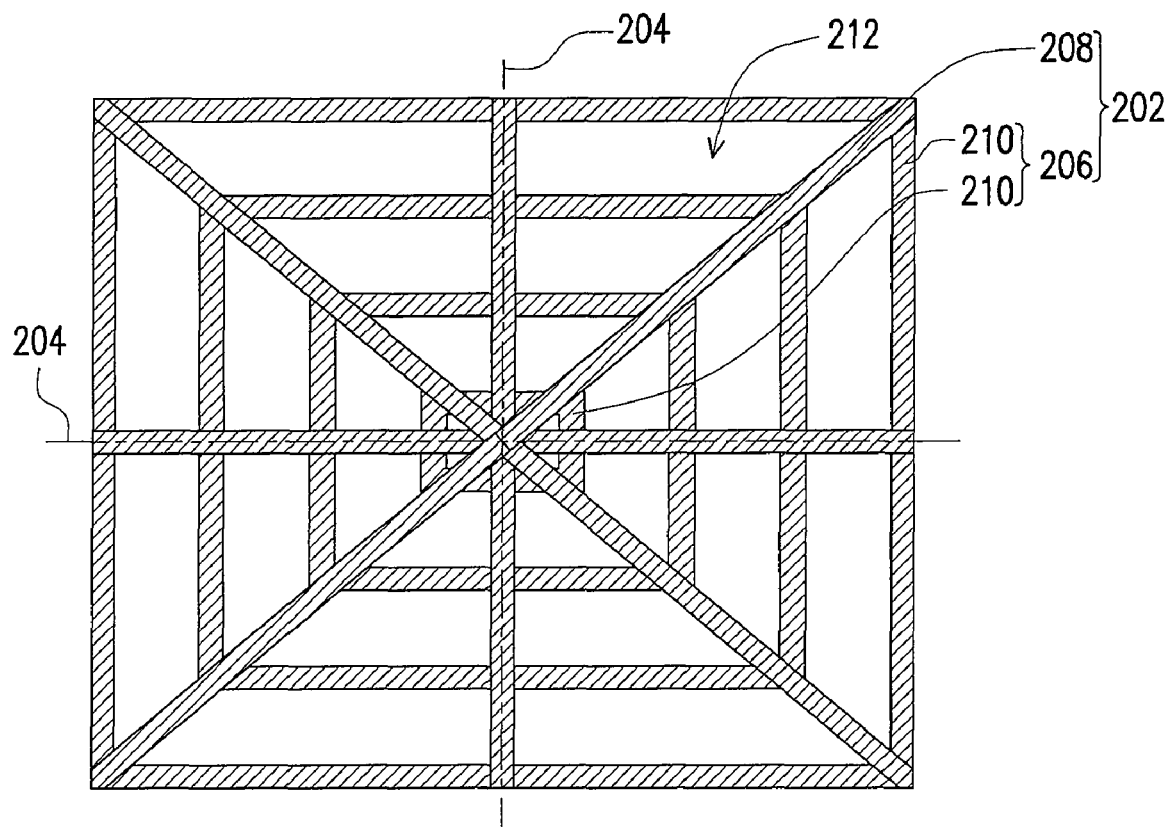
FIG. 2 is a top view of a diaphragm of an MEMS electroacoustic transducer according to a second embodiment of the present invention.

FIG. 2 is a top view of a diaphragm of the MEMS electroacoustic transducer according to a second embodiment of the present invention.

Referring to FIG. 2, the diaphragm 200 includes an axis-symmetrical pattern layer 202 having more than two symmetrical axes 204. In this embodiment, the axis-symmetrical pattern layer 202 is illustrated as a wheel-like pattern layer. The material of the axis-symmetrical pattern layer 202 is, for example, a conductive material.

The axis-symmetrical pattern layer 202 includes a concentric ring pattern 206 and a plurality of line patterns 208. The concentric ring pattern 206 includes a plurality of ring patterns 210. Each line pattern 208 is connected to the ring patterns 210, and one end of each line pattern 208 is positioned at a center of the concentric ring pattern 206, thereby forming the wheel-like pattern with gaps 212.

In the second embodiment, the outline of the axis-symmetrical pattern layer 202 is a rectangle in shape, but the present invention should not be limited to the rectangular outline. Rather, it is to be understood that the axis-symmetrical pattern layer 202, if desired, can have an outline of another shape, such as, circle, hexagon, octagon or dodecagon.

Likewise, in the diaphragm 200 of the second embodiment, the layout of the axis-symmetrical pattern layer 202 can match the pattern of the sound wave and, therefore, the diaphragm 200 can produce vibration with good uniformity.

Figure 3:
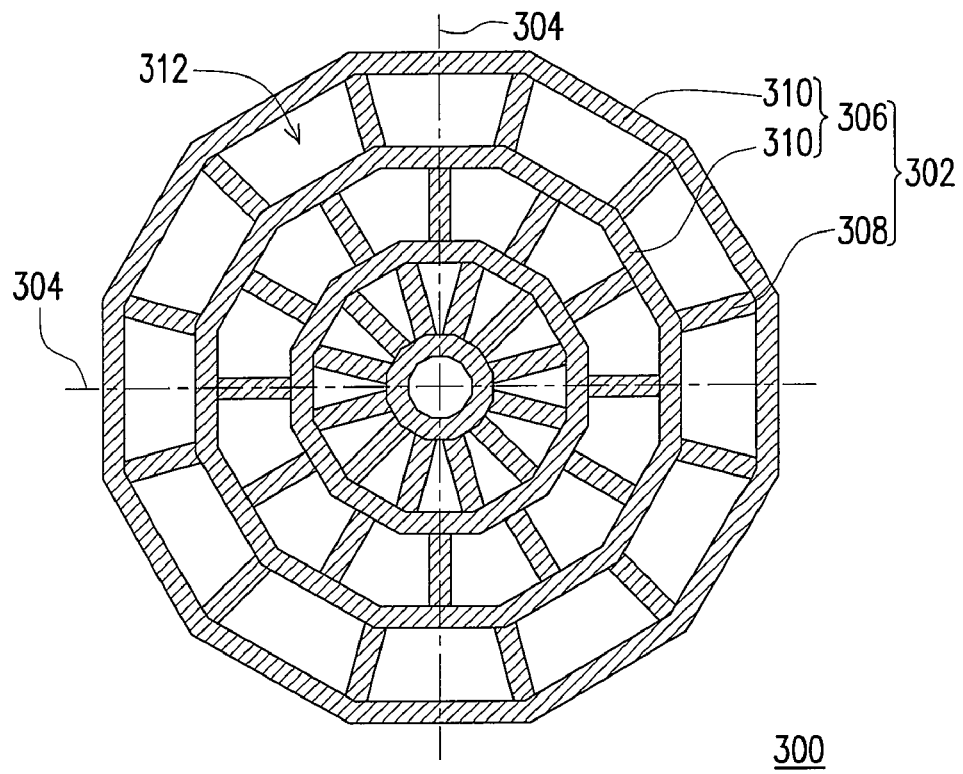
FIG. 3 is a top view of a diaphragm of an MEMS electroacoustic transducer according to a third embodiment of the present invention.

FIG. 3 is a top view of a diaphragm of the MEMS electroacoustic transducer according to a third embodiment of the present invention.

Referring to FIG. 3, the diaphragm 300 includes an axis-symmetrical pattern layer 302 having more than two symmetrical axes 304. In the third embodiment, the axis-symmetrical pattern layer 302 is illustrated as a spiderweb-like pattern layer. The material of the axis-symmetrical pattern layer 302 is, for example, a conductive material.

The axis-symmetrical pattern layer 302 includes a concentric ring pattern 306 and a plurality of line patterns 308. The concentric ring pattern 306 includes a plurality of ring patterns 310. Each line pattern 308 is disposed between and connects two adjacent ring patterns 310, thereby forming the spiderweb-like pattern with gaps 312.

In the third embodiment, the outline of the axis-symmetrical pattern 302 is a dodecagon in shape, but the present invention should not be limited to the dodecagonal outline. Rather, it is to be understood that the axis-symmetrical pattern layer 302, if desired, can have an outline of another shape, such as, circle, rectangle, hexagon, or octagon.

Likewise, in the diaphragm 300 of the third embodiment, the layout of the axis-symmetrical pattern layer 302 can match the pattern of the sound wave and, therefore, the diaphragm 300 can produce vibration with good uniformity.

Figure 4:
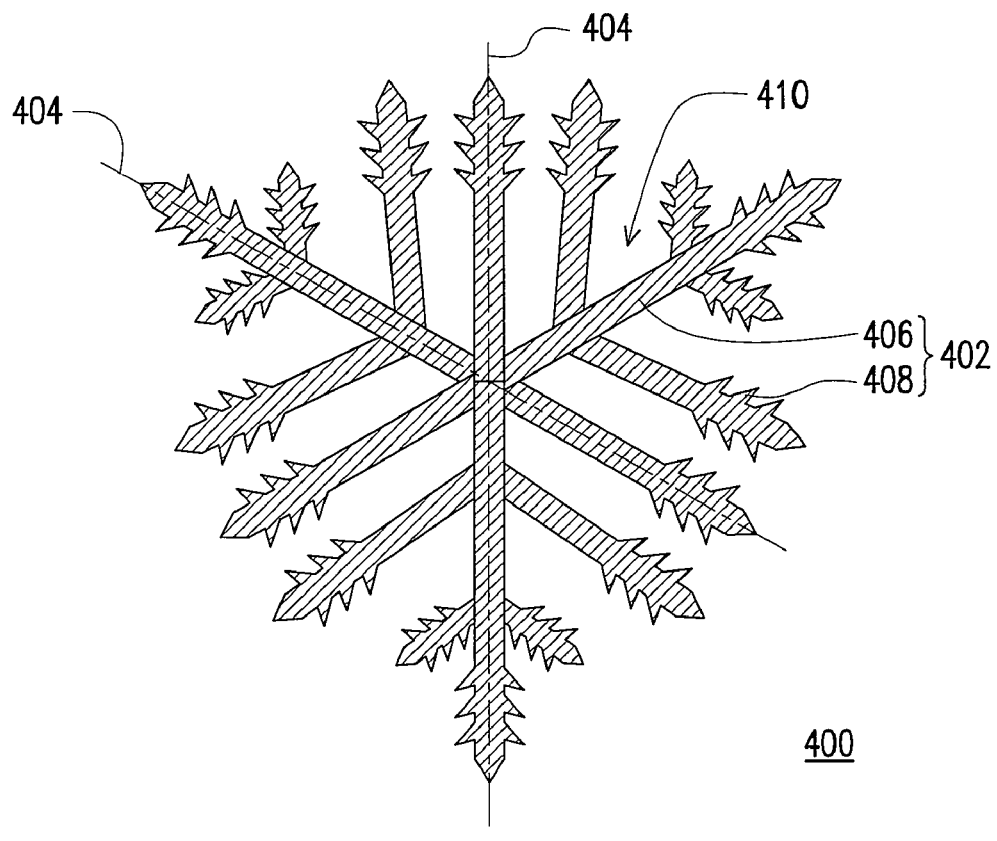
FIG. 4 is a top view of a diaphragm of an MEMS electroacoustic transducer according to a fourth embodiment of the present invention.

FIG. 4 is a top view of a diaphragm of the MEMS electroacoustic transducer according to a fourth embodiment of the present invention.

Referring to FIG. 4, the diaphragm 400 includes an axis-symmetrical pattern layer 402 having more than two symmetrical axes 404. In the fourth embodiment, the axis-symmetrical pattern layer 402 is illustrated as a snowflake-like pattern layer. The material of the axis-symmetrical pattern layer 402 is, for example, a conductive material. An exemplary layout of the snowflake-like pattern layer is described herein, but the present invention should not be limited to this particular layout. Rather, it is noted that the layout of the snowflake-like pattern layer referred by the present invention include the snowflake of all crystal forms.

The axis-symmetrical pattern layer 402 includes a plurality of main branch patterns 406 and a plurality of side branch patterns 408. The main branch patterns 406 are arranged radially, and one end of each side branch pattern 408 is connected to one main branch pattern 406, thereby forming the snowflake-like pattern with gaps 410. In addition, two adjacent side branch patterns 408 that are commonly connected to one same main branch pattern 406 may be arranged opposite to each other or staggerly. In the fourth embodiment, the adjacent side branch patterns 408 are illustrated as being arranged opposite to each other.

In the fourth embodiment, the outline of the axis-symmetrical pattern layer 402 is approximately a hexagon in shape, but the present invention should not be limited to the approximate hexagonal outline. Rather, it is to be understood that the axis-symmetrical pattern layer 402, if desired, can have an outline of another shape, such as, circle, rectangle, octagon or dodecagon.

Likewise, in the diaphragm 400 of the fourth embodiment, the layout of the axis-symmetrical pattern layer 402 can match the pattern of the sound wave and, therefore, the diaphragm 400 can produce vibration with good uniformity.

Figure 5:
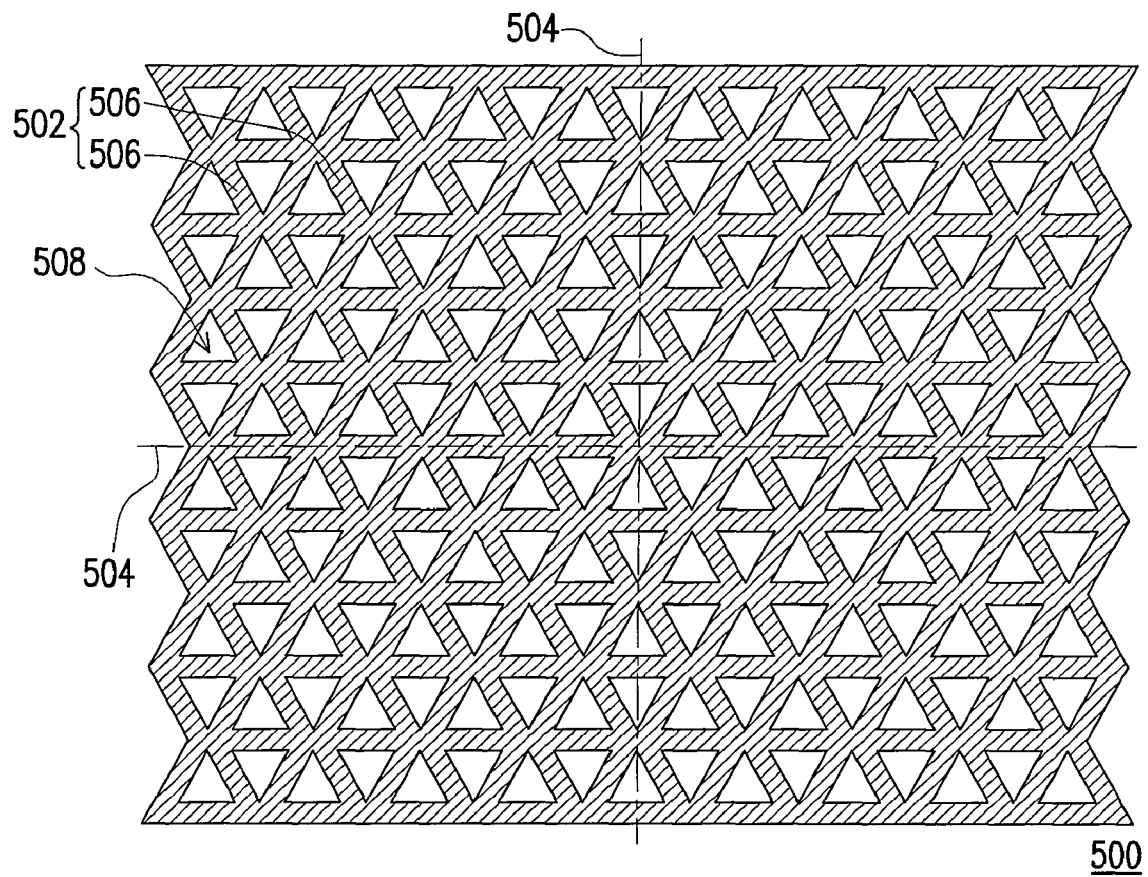
FIG. 5 is a top view of a diaphragm of an MEMS electroacoustic transducer according to a fifth embodiment of the present invention.

FIG. 5 is a top view of a diaphragm of the MEMS electroacoustic transducer according to a fifth embodiment of the present invention.

Referring to FIG. 5, the diaphragm 500 includes an axis-symmetrical pattern layer 502 having more than two symmetrical axes 504. In the fourth embodiment, the axis-symmetrical pattern layer 502 is illustrated as a mesh pattern layer. The material of the axis-symmetrical pattern layer 502 is, for example, a conductive material.

The axis-symmetrical pattern layer 502 includes a plurality of triangle ring patterns 506. The triangle ring patterns 500 are connected with each other at the vertexes, thereby forming the mesh pattern with gaps 508.

In the fifth embodiment, the outline of the axis-symmetrical pattern layer 502 is approximately a rectangle in shape, but the present invention should not be limited to the approximate rectangular outline. Rather, it is to be understood that the axis-symmetrical pattern layer 502, if desired, can have an outline of another shape, such as, circle, hexagon, octagon or dodecagon.

Likewise, in the diaphragm 500 of the fifth embodiment, the layout of the axis-symmetrical pattern layer 502 can match the pattern of the sound wave and, therefore, the diaphragm 500 can produce vibration with good uniformity.

Figure 6:
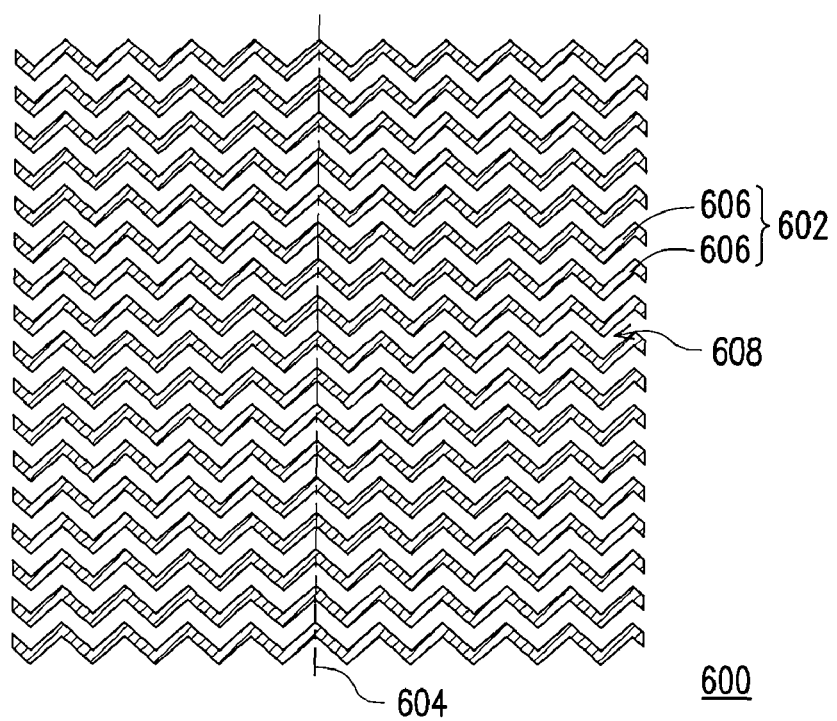
FIG. 6 is a top view of a diaphragm of an MEMS electroacoustic transducer according to a sixth embodiment of the present invention.

FIG. 6 is a top view of a diaphragm of the MEMS electroacoustic transducer according to a sixth embodiment of the present invention.

Referring to FIG. 6, the diaphragm 600 includes an axis-symmetrical pattern layer 602 having a single symmetrical axis 604. The material of the axis-symmetrical pattern layer 602 is, for example, a conductive material.

The axis-symmetrical pattern layer 602 includes a plurality of serrated line patterns 606. The serrated line patterns 606 are positioned in parallel with each other with gaps 608 formed therebetween.

In the sixth embodiment, the outline of the axis-symmetrical pattern layer 602 is approximately a rectangle in shape, but the present invention should not be limited to the approximate rectangular outline. Rather, it is to be understood that the axis-symmetrical pattern layer 602, if desired, can have an outline of another shape, such as, circle, hexagon, octagon or dodecagon.

Likewise, in the diaphragm 600 of the sixth embodiment, the layout of the axis-symmetrical pattern layer 602 can match the pattern of the sound wave and, therefore, the diaphragm 600 can produce vibration with good uniformity.

Figure 7:
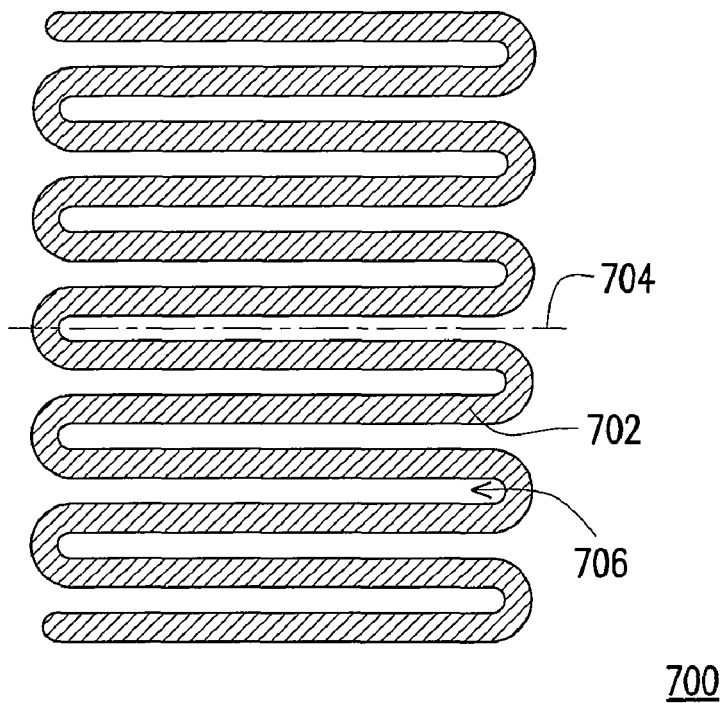
FIG. 7 is a top view of a diaphragm of an MEMS electroacoustic transducer according to a seventh embodiment of the present invention.

FIG. 7 is a top view of a diaphragm of the MEMS electroacoustic transducer according to a seventh embodiment of the present invention.

Referring to FIG. 7, the diaphragm 700 includes an axis-symmetrical pattern layer 702 having a single symmetrical axis 704. The material of the axis-symmetrical pattern layer 702 is, for example, a conductive material.

The axis-symmetrical pattern layer 702 is, for example, a serpentine pattern layer. The serpentine pattern layer extends to form continuous "S" configurations such that the axis-symmetrical pattern layer 702 forms a plurality of gaps 706 therein.

In the seventh embodiment, the outline of the axis-symmetrical pattern layer 702 is approximately a rectangle in shape, but the present invention should not be limited to the approximate rectangular outline. Rather, it is to be understood that the axis-symmetrical pattern layer 702, if desired, can have an outline of another shape, such as, circle, hexagon, octagon or dodecagon.

Likewise, in the diaphragm 700 of the seventh embodiment, the layout of the axis-symmetrical pattern layer 702 can match the pattern of the sound wave and, therefore, the diaphragm 700 can produce vibration with good uniformity.

Figure 8:
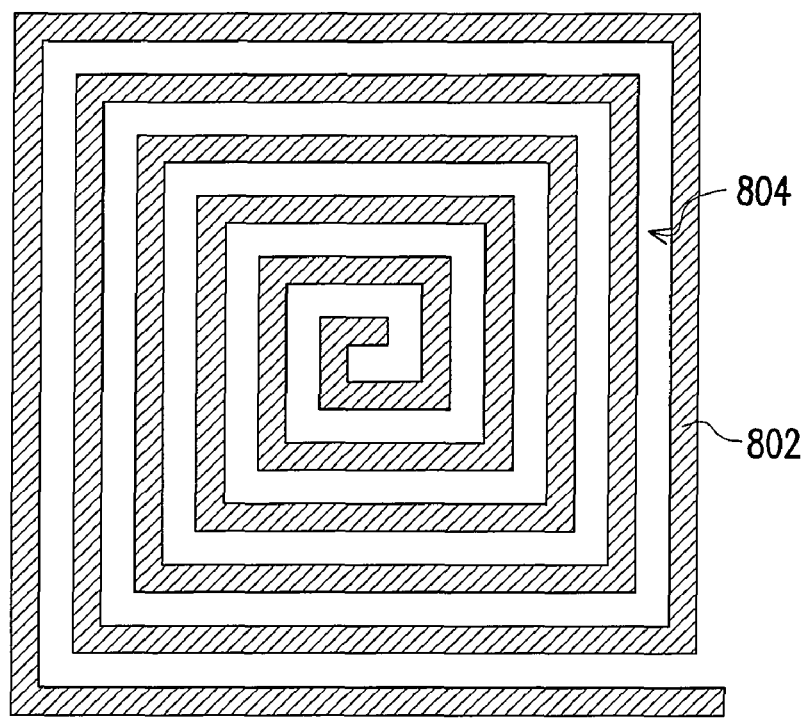
FIG. 8 is a top view of a diaphragm of an MEMS electroacoustic transducer according to an eighth embodiment of the present invention.

FIG. 8 is a top view of a diaphragm of the MEMS electroacoustic transducer according to an eighth embodiment of the present invention.

Referring to FIG. 8, the diaphragm 800 includes a spiral pattern layer 802. The material of the spiral pattern layer 802 is, for example, a conductive material.

The spiral pattern layer 802 includes one end swirling into an inside of the spiral pattern layer 802, and another end located at an outside of the spiral pattern layer 802 such that the spiral pattern layer 802 forms a gap 804 therein. The end of the spiral pattern layer 802 can swirl into the inside in either a clockwise direction or a counter-clockwise direction. In the eighth embodiment, the end of the spiral pattern layer 802 extends into the inside in the clockwise direction.

In the eighth embodiment, the outline of the spiral pattern layer 802 is approximately a rectangle in shape, but the present invention should not be limited to the approximate rectangular outline. Rather, it is to be understood that the spiral pattern layer 802, if desired, can have an outline of another shape, such as, circle, hexagon, octagon or dodecagon.

Likewise, in the diaphragm 800 of the eighth embodiment, the layout of the spiral pattern layer 802 can match the pattern of the sound wave and, therefore, the diaphragm 800 can produce vibration with good uniformity.

In addition, the diaphragm described in the above embodiments may further include an outer frame. The outer frame encloses and is connected to the pattern layer of the diaphragm for increasing the structural strength of the diaphragm. The outer frame is described in an exemplary ninth embodiment below and should not be regarded as limiting.

Figure 9:
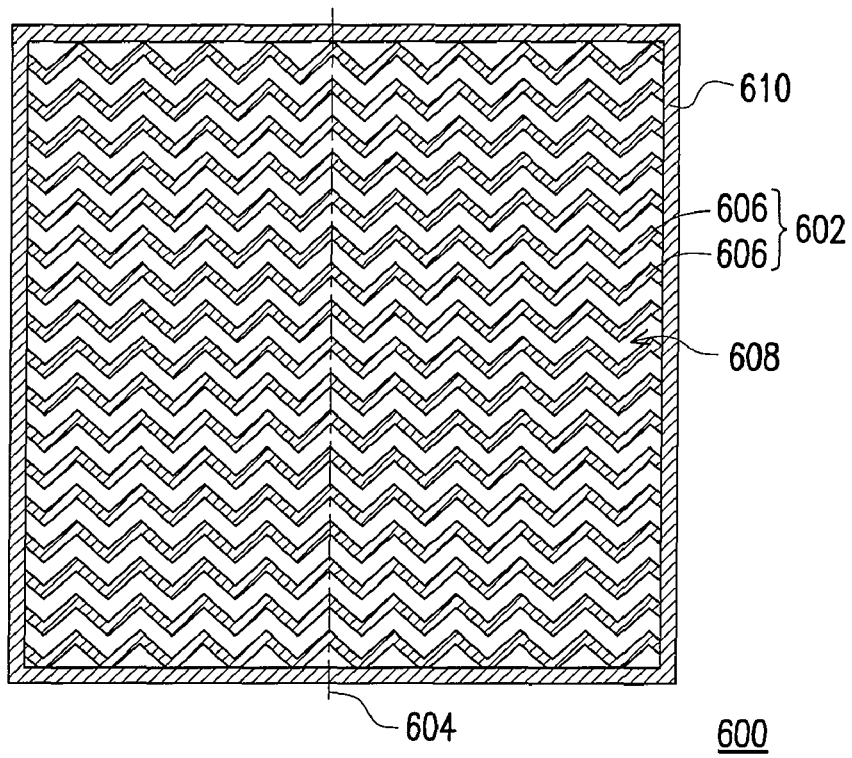
FIG. 9 is a top view of a diaphragm of an MEMS electroacoustic transducer according to a ninth embodiment of the present invention.

FIG. 9 is a top view of a diaphragm of the MEMS electroacoustic transducer according to a ninth embodiment of the present invention. In FIG. 9, those elements that are the same as in FIG. 6 are given the same numerals and their descriptions are not repeated herein.

Referring to FIG. 6 and FIG. 9, the diaphragm 600' of the ninth embodiment is different from the diaphragm 600 of the sixth embodiment in that the diaphragm 600' further includes an outer frame 610. The outer frame 610 encloses and is connected to the axis-symmetrical pattern layer 602 for increasing the structural strength of the diaphragm 600'. In this embodiment, the outer frame 610 is a rectangle in shape, but the present invention should not be limited to the rectangular frame. Rather, it is to be understood that the outer frame 610, if desired, can be of another shape, such as, circle, hexagon, octagon or dodecagon. Except for the outer frame 610, the material, function and other implementations of other elements of the diaphragm 600' of the ninth embodiment is substantially the same as the sixth embodiment and, therefore, are not repeated herein.

Besides, the pattern of the diaphragm of the MEMS electroacoustic transducer of the present invention could be a combination pattern of two or more patterns chosen from the first to ninth embodiments.

In addition, the diaphragm described in the above embodiments may further include a sealing agent layer for sealing the pattern layer of the diaphragm. When the diaphragm is used in the MEMS electroacoustic transducer, the sealing agent layer can establish an air-tight environment. The sealing agent layer is described in an exemplary tenth embodiment below and should not be regarded as limiting.

Figure 10:
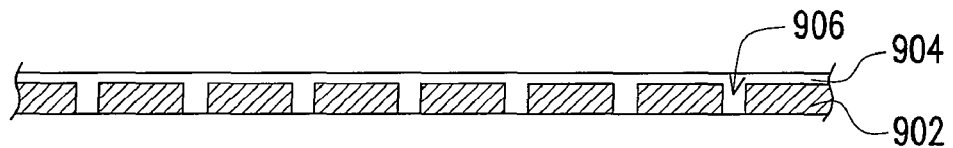
FIG. 10 is a cross-sectional view of a diaphragm of an MEMS electroacoustic transducer according to a tenth embodiment of the present invention.

FIG. 10 is a cross-sectional view of a diaphragm of an MEMS electroacoustic transducer according to a tenth embodiment of the present invention.

Referring to FIG. 10, the diaphragm 900 includes a pattern layer 902 and a sealing agent layer 904. The pattern layer 902 can be implemented as any one of the axis-symmetrical pattern layers or spiral pattern layers described in the first through ninth embodiments above. The sealing agent layer 904 seals the pattern layer 902 and fills the gaps 906 in the pattern layer 902.

In addition, it is noted that the sealing agent layer 904, if desired, can selectively form one or more vent holes.

On the other hand, the diaphragm described in the embodiments above can include two or more than two pattern layers. The pattern layers are arranged in a stack with one on top of another, which can increase the structural strength of the diaphragm. The multi pattern layers configuration is described in an exemplary eleventh embodiment below and should not be regarded as limiting.

Figure 11:
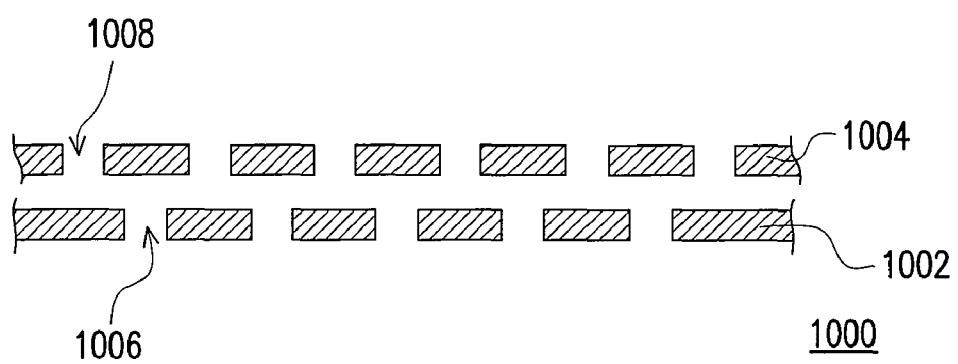
FIG. 11 is a cross-sectional view of a diaphragm of an MEMS electroacoustic transducer according to an eleventh embodiment of the present invention.

FIG. 11 is a cross-sectional view of a diaphragm of an MEMS electroacoustic transducer according to an eleventh embodiment of the present invention.

Referring to FIG. 11, the diaphragm 1000 includes a pattern layer 1002 and a pattern layer 1004. The pattern layer 1002 and the pattern layer 1004 may be implemented as any one of the axis-symmetrical pattern layers or spiral pattern layers described in the first through ninth embodiments above.

The pattern layer 1004 is disposed on top of the pattern layer 1002 for increasing the strength of the diaphragm 1000. The pattern layer 1004 and the pattern layer 1002 may be arranged such that, for example, the patterns of the pattern layer 1004 cover the gaps 1006 in the pattern layer 1002 and the gaps 1008 in the pattern layer 1004 are disposed above the patterns of the pattern layer 1002.

In summary, the diaphragms described in the embodiments above have at least the following advantages.

1. The diaphragm of the MEMS electroacoustic transducer can provide good uniformity of vibration.
2. The diaphragm, when used in an MEMS electroacoustic transducer, can improve the performance of the MEMS electroacoustic transducer.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A diaphragm of an MEMS electroacoustic transducer, comprising a plurality of serrated line patterns, wherein all of the serrated line patterns are positioned in parallel with each other, adjacent serrated line patterns are spaced apart and without other line patterns disposed therebetween.

2. A diaphragm of an MEMS electroacoustic transducer, comprising a first axis-symmetrical pattern layer and at least one second axis-symmetrical pattern layer positioned on top of the first axis-symmetrical pattern layer, wherein material of the first axis-symmetrical pattern layer is the same as material of the at least one second axis-symmetrical pattern layer, each of the first axis-symmetrical pattern layer and the second axis-symmetrical pattern layer has a plurality of gaps and a plurality of patterns, the patterns of the second axis-symmetrical pattern layer cover all of the gaps in the first axis-symmetrical pattern layer, and all of the gaps in the second axis-symmetrical pattern layer are disposed above the patterns of the first axis-symmetrical pattern layer.

* * * * *